(12) United States Patent
Bandic et al.

(10) Patent No.: US 10,152,435 B2
(45) Date of Patent: Dec. 11, 2018

(54) COHERENT CONTROLLER

(71) Applicant: Western Digital Technologies, Inc., Irvine, CA (US)

(72) Inventors: Zvonimir Z. Bandic, San Jose, CA (US); Luis Vitorio Cargnini, San Jose, CA (US); Dejan Vucinic, San Jose, CA (US); Qingbo Wang, Irvine, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 135 days.

(21) Appl. No.: 15/423,205

(22) Filed: Feb. 2, 2017

(65) Prior Publication Data

US 2017/0364459 A1    Dec. 21, 2017

Related U.S. Application Data

(60) Provisional application No. 62/352,336, filed on Jun. 20, 2016.

(51) Int. Cl.
*G06F 13/26* (2006.01)
*G06F 13/00* (2006.01)
(Continued)

(52) U.S. Cl.
CPC ...... *G06F 13/1615* (2013.01); *G06F 13/1663* (2013.01); *G06F 13/1673* (2013.01); *G11C 11/005* (2013.01)

(58) Field of Classification Search
None
See application file for complete search history.

(56) References Cited

U.S. PATENT DOCUMENTS 7,143,246 B2    11/2006  Johns
7,577,794 B2     8/2009  Beukema et al.
(Continued)

FOREIGN PATENT DOCUMENTS

CN    104360963 A    2/2015

OTHER PUBLICATIONS

Azarkhish et al., "A case for three-dimensional stacking of tightly coupled data memories over multi-core clusters using low-latency interconnects", IET Comput. Digit. Tech., May 2013, vol. 7, Iss. 5, pp. 191-199.

*Primary Examiner* — Hyun Nam
(74) *Attorney, Agent, or Firm* — Patterson & Sheridan, LLP; Steven Versteeg

(57) ABSTRACT

A system includes a bus, at least one processor coupled to the bus, and a storage device coupled to the bus. The storage device includes storage class memory, a buffer; and a controller. The controller is configured to receive an instruction to provide data to the bus. Responsive to receiving the instruction to provide data to the bus, the controller is configured to retrieve data from the storage class memory, update the buffer to represent the data retrieved from the storage class memory, and output, at the bus, an indication that data responsive to the instruction to provide data to the bus is available at the buffer. The at least one processor is configured to refrain from modifying local data corresponding to the instruction to provide data to the bus after the controller receives the instruction to provide data to the bus and before the controller outputs the indication.

24 Claims, 5 Drawing Sheets

(51) Int. Cl.
*G06F 13/16* (2006.01)
*G11C 11/00* (2006.01)

(56) References Cited

U.S. PATENT DOCUMENTS

| | | |
|---|---|---|
| 7,996,625 B2 | 8/2011 | Khare et al. |
| 2005/0210041 A1* | 9/2005 | Taguchi ............... G06F 3/0605 |
| 2010/0148934 A1* | 6/2010 | Nasser ................... H04Q 9/00 340/10.4 |
| 2010/0250895 A1* | 9/2010 | Adams ............... G06F 12/1009 711/207 |
| 2011/0093646 A1* | 4/2011 | Koka ................. G06F 12/0817 711/103 |
| 2011/0307653 A1 | 12/2011 | Rudelic et al. |
| 2014/0052929 A1* | 2/2014 | Gulati ............... G06F 12/0815 711/141 |
| 2014/0082410 A1 | 3/2014 | Ziakas et al. |
| 2015/0248367 A1 | 9/2015 | Tucek |
| 2017/0364459 A1* | 12/2017 | Bandic ............. G06F 13/1615 |

\* cited by examiner

COHERENT CONTROLLER

This application claims the benefit of U.S. Provisional Application No. 62/352,336 filed Jun. 20, 2016, which is incorporated herein by reference in its entirety.

TECHNICAL FIELD

The disclosure generally relates to storage devices.

BACKGROUND

A bus is a communication system that transfers data between devices. Buses may be coherent, which ensure that modifications to a cache line are seen in the same order by all participants on a coherence domain. Said differently, coherence buses may use protocols and models that propagate a modification in a cache line to each participant (e.g., processor or memory controller) of a coherence domain. An operation of a device requesting the data may cease while data is transferred on the bus. For example, a processor requesting data from a storage device may cease other operations until the requested data is available on the bus. In an attempt to maximize usage of devices on a bus, delays in providing data on the bus are minimized.

SUMMARY

In some examples, a system includes a bus, at least one processor coupled to the bus, and a storage device coupled to the bus. The storage device includes storage class memory, a buffer; and a controller. The controller is configured to receive an instruction to provide data to the bus. Responsive to receiving the instruction to provide data to the bus, the controller is configured to retrieve data from the storage class memory, update the buffer to represent the data retrieved from the storage class memory, and output, at the bus, an indication that data responsive to the instruction to provide data to the bus is available at the buffer. The at least one processor is configured to refrain from modifying local data corresponding to the instruction to provide data to the bus after the controller receives the instruction to provide data to the bus and before the controller outputs the indication.

In some examples, a method includes receiving, by a coherent controller, an instruction to provide data to a coherence bus, where at least one processor is coupled to the coherence bus. The method may further include, responsive to receiving the instruction to provide data to the coherence bus, fetching, by the coherent controller, data from storage class memory, updating, by the coherent controller, a buffer to represent the data retrieved from the storage class memory, and writing, by the coherent controller, at the coherence bus, an indication that data responsive to the instruction to provide data to the coherence bus is available at the buffer. The at least one processor is configured to refrain from modifying local data corresponding to the instruction to provide data to the coherence bus after the coherent controller receives the instruction to provide data to the coherence bus and before the controller writes the indication.

In some examples, a non-transitory computer-readable storage medium encoded with instructions that, when executed, cause a controller to receive an instruction to provide data to a bus, where at least one processor is coupled to the bus. Responsive to receiving the instruction to provide data to the bus, the instructions further cause the controller to retrieve data from a storage class memory, update a buffer to represent the data retrieved from the storage class memory, and output, at the bus, an indication that data responsive to the instruction to provide data to the bus is available at the buffer. The at least one processor is configured to refrain from modifying local data corresponding to the instruction to provide data to the bus after the controller receives the instruction to provide data to the bus and before the controller outputs the indication.

In some examples, a system includes means for receiving an instruction to provide data to a bus and means for retrieving data from storage class memory in response to receiving the instruction to provide data to the bus. The system further includes means for updating a buffer to represent the data retrieved from the storage class memory in response to receiving the instruction to provide data to the bus and means for outputting at the bus an indication that data responsive to the instruction to provide data to the bus is available at the buffer in response to receiving the instruction to provide data to the bus. At least one processor is configured to refrain from modifying local data corresponding to the instruction to provide data to the bus after the controller receives the instruction to provide data to the bus and before the controller outputs the indication.

The details of one or more examples are set forth in the accompanying drawings and the description below. Other features, objects, and advantages will be apparent from the description and drawings, and from the claims.

DETAILED DESCRIPTION

The techniques of this disclosure may enable storage devices to directly access a coherence bus used by a processor. For example, rather than transferring data using a non-coherence bus (e.g., a PCI Express (PCIe) or serial AT attachment (SATA) bus) and then providing the data in a separate memory or cache accessible to a coherence bus used by a processor, a storage device controller transfers the data to a buffer on the storage device that is accessible to the coherence bus used by the processor. To reduce delay in providing the data to the buffer, the storage device may include a storage class memory (e.g., phase change memory, resistive random-access memory, or another storage class memory).

Additionally, in some examples, the storage device may include a coherent controller, and a processor may access data stored on the storage device using the coherent controller. The coherent controller may provide functionality enabling use of storage class memory, such as phase change memory, resistive random-access memory, or the like. For example, the coherent controller may be configured to perform error correction that accounts for a higher bit error rate that may occur in some storage class memory compared to dynamic random-access memory (DRAM). As another example, the coherent controller may manage wear leveling of the storage class memory. More specifically, techniques of this disclosure may enable storage class memory of a storage device to be directly accessed, via a coherence bus, by a processor rather than requiring further interfaces that add to a latency of reading from and writing data to the storage device. In this way, storage devices may be configured to directly access a coherence bus to permit storage class memory to be more effectively used, which may increase an input/output operations per second (IOPS) of the storage device, thereby improving a response time of a resulting computing device using the storage device.

Figure 1:
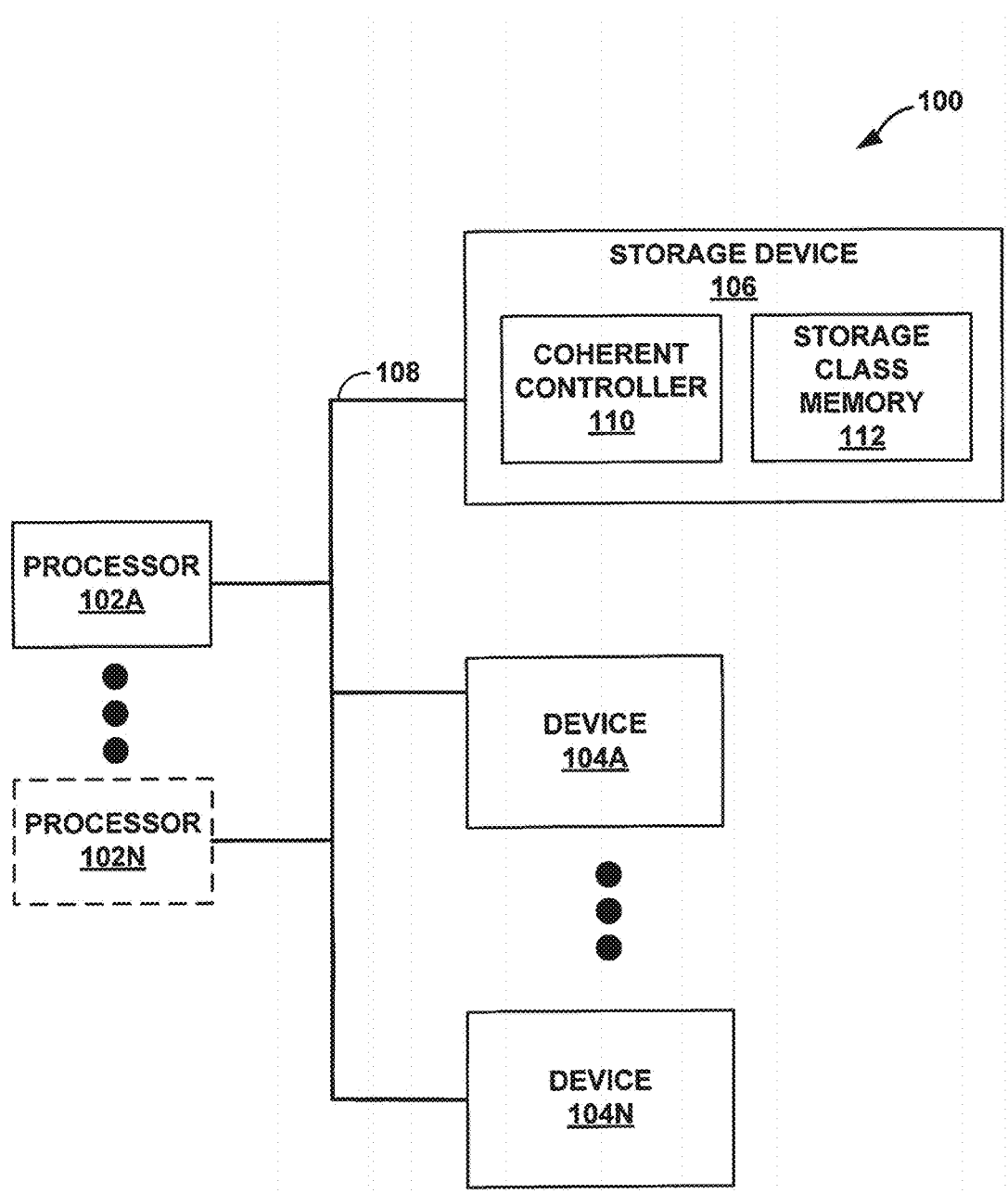
FIG. 1 is a conceptual and schematic block diagram illustrating an example storage environment that includes an example storage device configured to directly access a coherence bus, in accordance with one or more techniques of this disclosure.

FIG. 1 is a conceptual and schematic block diagram illustrating an example storage environment 100 that includes an example storage device 106 configured to directly access a coherence bus 108, in accordance with one or more techniques of this disclosure. Storage environment 100 may utilize memory devices included in storage device 106 to store and retrieve data. Storage environment 100 may include any computing device, including, for example, a computer server, a network attached storage (NAS) unit, a desktop computer, a notebook (e.g., laptop) computer, a tablet computer, a set-top box, a mobile computing device such as a "smart" phone, a television, a camera, a display device, a digital media player, a video gaming console, a video streaming device, or the like. Storage environment 100 may include processor 102A connected by coherence bus 108 to storage device 106 and one or more other devices 104A-104N (collectively, "devices 104"). As shown, storage environment 100 may optionally include processors 102B-N, which may be substantially similar to processor 102A. In some examples, coherence bus 108 may support communication between processor 102A with storage device 106 and devices 104.

Processor 102A may be a central processing unit (CPU) of storage environment 100. For example, processor 102A may be formed on a single integrated circuit (IC) or multiple ICs. In some examples, processor 102A may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, processors 102B-N are substantially similar to processor 102A.

Devices 104 may include any device that may be connected, via coherence bus 108, to processor 102. For example, device 104A may include a graphical processor unit (GPU) and device 104N may be a cache (e.g., level 1 (L1), level 2 (L2), level 3 (L3), or another cache) used by processor 102. As another example, devices 104 may include system memory (e.g., dynamic random-access memory (DRAM)), a network interface card (NIC), or the like.

Storage device 106 may be any device suitable for non-volatile storing of data that may be accessed by processor 102A using coherence bus 108. As shown, storage device 106 may include a storage class memory 112 and a coherent controller 110 configured to communicate with processor 102A and devices 104 via coherence bus 108. Storage class memory 112 may include a relatively fast, non-volatile memory to store the data that may be accessed by processor 102A using coherence bus 108. Examples of storage class memory 112 may include, for instance, phase change memory, which may have an access time of less than 1 microsecond; resistive random-access memory, which may an access time of less than 1 microsecond, magnetoresistive random access memory (MRAM); ferroelectric random access memory (FeRAM); 3D XPoint memory; or another relatively fast, non-volatile memory.

Coherence bus 108 may be any suitable bus or network configured to move data, such as cache lines, for processor 102A while allowing devices connected to coherence bus 108 to maintain data coherency across all devices connected to coherence bus 108. In some examples, devices connected to coherence bus 108 may utilize one or more coherence protocols so that all modifications to data exchanged via coherence bus 108, such as a cache line, are seen in the same order by all participants on the coherent domain. Examples of coherence protocols may include, but are not limited to, INTEL® Quick Path Interconnect (QPI)®, on-chip and socket-to-socket; AMD® Coherent HyperTransport®, a DDR socket-to-socket link; IBM PowerBus®; ARM® CHI-400®; ARM® 4 ACE; ARM® CHI-400/500®; RapidIO®, a 4G® telecom fabric with coherence protocol; modified shared invalid (MSI); modified, owned, shared, invalid (MOSI); dirty shared, modified, owned, exclusive, shared, invalid (D-MOSI); modified, exclusive, shared, invalid, and forward (MESIF); modified, owned, exclusive, shared, invalid (MOESI); and other coherence protocols. In some examples, coherence protocols may include states. For example, an MSI protocol may include a modified state, shared state, and invalid state. In some examples, coherence bus 108 may operate at 300 gigabytes per second (GIB/s) with a 40 nanoseconds (ns) latency on die, chip to chip. In some examples, coherence bus 108 may be fast and/or have wide ports for peripherals to join a coherence domain of the coherence bus 108. For example, coherence bus 108 may include an opening into programmable logic and/or scalable fabric (e.g., RapidIO). In some examples, coherence bus 108 may be configured for high variability in main memory response times.

Storage device 106 may connect to coherence bus 108 using any suitable attachment. For example, storage device 106 may connect to coherence bus 108 using a CPU socket of a motherboard. For instance, storage device 106 may connect to coherence bus 108 using a first QPI® CPU socket of a motherboard and processor 102A may connect to coherence bus 108 using a second QPI® CPU socket of the motherboard. In some examples, storage device 106 may connect to coherence bus 108 using an accelerator processor interface. For instance, storage device 106 may connect to coherence bus 108 using a coherent accelerator processor interface (CAPI) of a motherboard and processor 102A may connect to coherence bus 108 using a CPU socket of the motherboard. In some instances, storage device 106 may connect to coherence bus 108 using an accelerator coherency port (ACP) of a motherboard and processor 102A may connect to coherence bus 108 using a CPU socket of the motherboard. In some instances, storage device 106 may connect to coherence bus 108 using AXI Coherency Extensions (ACE).

Coherent controller 110 may receive an instruction to provide data to coherence bus 108. For example, coherent controller 110 may receive, at a register of storage device 106, from processor 102, via coherence bus 108, an instruction to provide data stored at a virtual address (e.g., a logical block address (LBA)) to coherence bus 108. Responsive to receiving the instruction to provide data to the bus, coherent controller 110 may retrieve data from storage class memory 112. For example, coherent controller 110 may translate the LBA to a physical address (e.g., a physical block address (PBA)) and retrieve data stored in storage class memory 112 of storage device 106 at the physical address. Coherent controller 110 may update a buffer to represent the data retrieved from the storage class memory 112. For example, coherent controller 110 may write the data retrieved from storage class memory 112 into a memory of coherent controller 110 or into a portion of storage class memory 112 dedicated for use as a buffer. In some examples, coherent controller 110 may write the data retrieved from storage class memory 112 into a fast, volatile memory of storage device 106.

In any case, coherent controller 110 may output, at coherence bus 108, an indication that the requested data is available at the buffer of storage device 106. For example, coherent controller 110 may output, at coherence bus 108, to processor 102, an indication that the requested data is available at the memory of coherent controller 110, at the portion of storage class memory 112 dedicated for use as a buffer, or at a fast, volatile memory of storage device 106. In this manner, coherent controller 110 may transfer data directly to a buffer that is accessible, via coherence bus 108, by processor 102, which may increase an input/output operations per second (IOPS) of storage device 106, thereby improving a response time of storage environment 100.

In some examples, coherent controller 110 may manage wear leveling of storage class memory 112. Some storage class memory 112 may wear out over time (e.g., over a plurality of write or erase cycles). Hence, coherent controller 110 may implement one or more wear leveling algorithms to spread writes among physical locations of storage class memory 112 and utilize the physical locations of storage class memory 112 more evenly, thereby extending useful life of storage class memory 112.

As another example, coherent controller 110 may perform error correction on data retrieved from storage class memory 112. Some storage class memory 112 may experience errors at higher rates than some volatile memory devices, such as DRAM. Because of this, coherent controller 110 may perform more robust error correction on data retrieved from storage class memory 112 to reduce a likelihood of errors in the data retrieved from storage class memory 112. Upon writing data from processor 102A to storage class memory 112, coherent controller 110 may encode parity data, redundancy data, or other error correction data along with the data to be written, and write both the error correction data and the data from processor 102A to storage class memory 112. Upon reading the data from storage class memory 112, coherent controller 110 may utilize the error correction data to confirm (or restore) validity of the data prior to making the data available to coherence bus 108 at the buffer of storage device 106.

As other examples, coherent controller may encrypt and decrypt data stored in storage class memory 112, translate a virtual address used by processor 102A (e.g., an LBA) to a physical address used by coherent controller 110 (e.g., a PBA; to facilitate wear leveling and the like), and operate storage device 106 in compliance with one or more coherence protocols that ensure that all modifications to a cache line of coherence bus 108 are seen in the same order by all participants on the coherent domain (e.g., processor 102, devices 104, storage device 106, or another component connected to coherence bus 108). In some examples, coherent controller 110 may be implemented in software, firmware, hardware, or combinations thereof. For instance, coherent controller 110 may include firmware that, when executed, manages wear leveling of storage class memory 112, error corrects data retrieved from storage class memory 112, encrypts and decrypts data stored in storage class memory 112, ensures that storage device 106 operates in compliance with one or more coherence protocols, or the like.

In this way, coherent controller 110 may facilitate connection of storage device 106, which utilizes non-volatile, storage class memory 112, directly to coherence bus 108. This may enable processor 102A to benefit from the relatively low latency and relatively high throughput of storage class memory 112, and, in some examples, may allow removal of one or more levels in the memory hierarchy of system 100 (e.g., DRAM).

Figure 2:
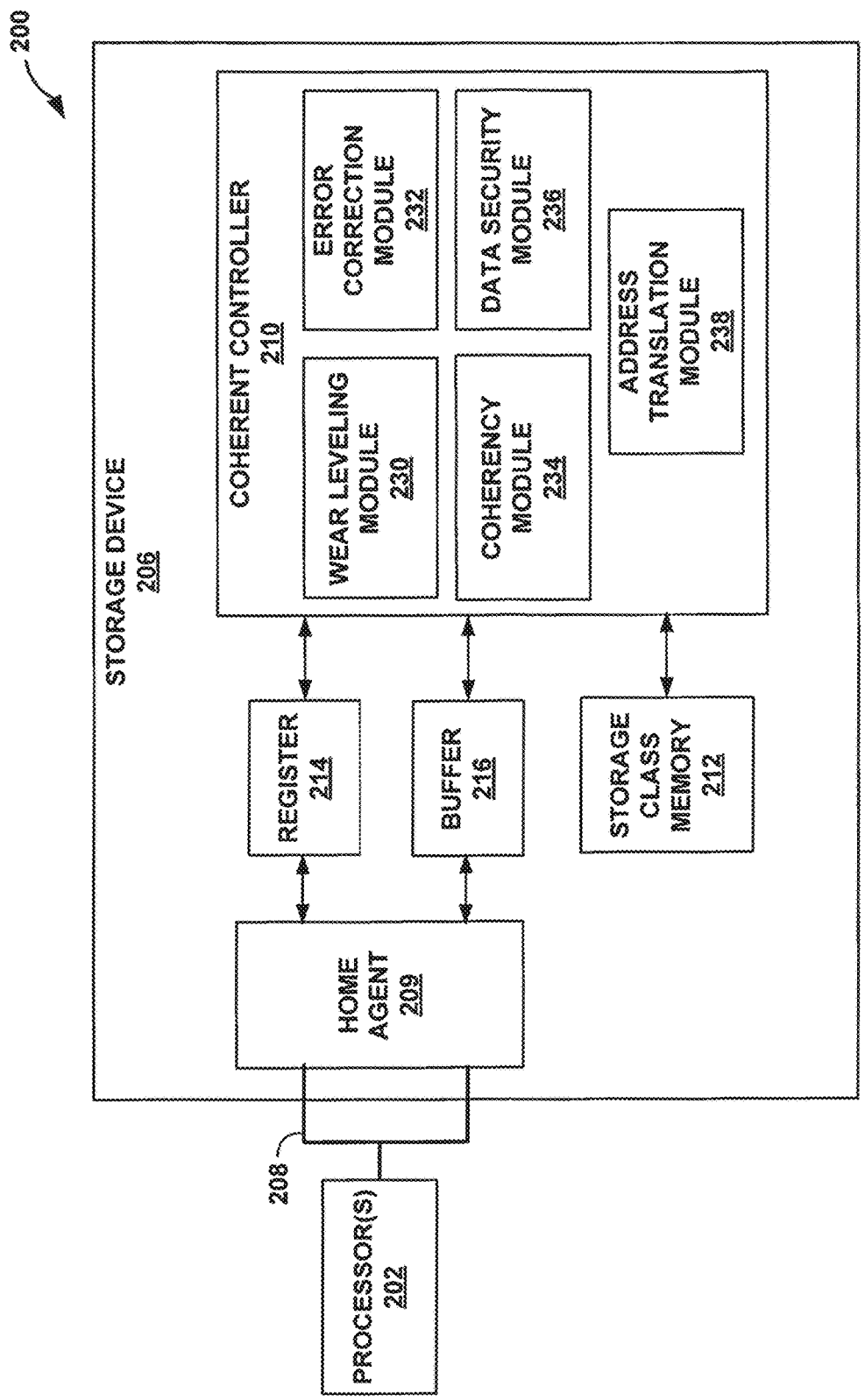
FIG. 2 is a conceptual and schematic block diagram illustrating an example storage environment that includes an example storage device configured to directly access a coherence bus, in accordance with one or more techniques of this disclosure.

FIG. 2 is a conceptual and schematic block diagram illustrating an example storage environment 200 that includes a storage device 206 configured to directly access a coherence bus 208, in accordance with one or more techniques of this disclosure. As illustrated in FIG. 2, storage device 206 may be connected, via coherence bus 208, to processor(s) 202. Storage device 206, coherence bus 208, and processor(s) 202 may be similar to or substantially the same as the corresponding components described with reference to FIG. 1, aside from differences described herein.

Storage device 206 may include home agent 209, coherent controller 210, register 214, buffer 216, and storage class memory 212. Coherent controller 210 may be an example of coherent controller 110 of FIG. 1. Storage class memory 212 may be an example of storage class memory 112 of FIG. 1. In some examples, storage device 206 may include additional components not shown in FIG. 2 for sake of clarity. For example, storage device 206 may include power delivery components, including, for example, a capacitor, super capacitor, or battery; a printed board (PB) to which components of storage device 206 are mechanically attached and which includes electrically conductive traces that electrically interconnect components of storage device 206; or the like.

Home agent 209 may be configured to execute logic that keeps the state of buffer 216 and register coherence with caches. For example, home agent 209 may receive a MOESI and/or MESIF request from one or more cores of processor(s) 202. More specifically, home agent 209 may be configured to track which cache is holding onto what cache line. Said differently, home agent 209 may be configured to maintain a mapping between cache and a cache line and, based on the mapping, may determine a cache corresponding to a cache line.

Register 214 may be configured to store instructions to permit processor(s) 202 to access data stored at buffer 216. For example, register 214 may include information relating to fetching information from and writing information to buffer 216. Examples of register 214 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). In some examples, register 214 may be implemented as a part of coherent controller 210, rather than as a separate component. Additionally, or alternatively, in some examples, storage device 206 may include a plurality of registers, rather than the single register 214 illustrated in FIG. 2.

Buffer 216 may be configured to store data that may be accessed by processor(s) 202. For example, buffer 216 may store the data requested, by processor(s) 202, that is stored by storage class memory 212. Examples of buffer 216 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). In some examples, buffer 216 may be implemented as a part of coherent controller 210, rather than as a separate component. In some examples, buffer 216 may be implemented as a dedicated portion of storage class memory 212.

In some examples, coherent controller 210 may include at least one of a wear leveling module 230, an error correction module 232, a coherency module 234, a data security module 236, or an address translation module 238. Modules 230, 232, 234, 236, and 238 may be implemented in software, firmware, hardware, or a combination of two or more of software, firmware, and hardware. In other examples, coherent controller 210 may include additional modules or hardware units, or may include fewer modules or hardware units. Coherent controller 210 may include a microprocessor, digital signal processor (DSP), application specific integrated circuit (ASIC), field programmable gate array (FPGA), or other digital logic circuitry.

Wear leveling module 230 may be configured to manage write operations to physical locations storage class memory 212 for prolonging a service life of storage class memory 212. For example, wear leveling module 230 may distribute erasures and re-writes substantially evenly (e.g., evenly or nearly evenly) to physical locations of storage class memory 212. Examples of wear leveling techniques may include, but are not limited to, flash-like translation layer techniques, start-gap schemes, or other wear leveling techniques. In some examples, wear leveling module 230 may use one or more translation schemes that are fast but have high up-front computational costs. For instance, wear leveling module 230 may store pre-computed vectors as fuses for coherent controller 210.

In some examples, wear leveling module 230 may work with data security module 236. For instance, rather than relying on scrubbing of data stored at storage class memory 212, which may not be adequate, wear leveling module 230 may initiate data security module 236 to perform encryption of a non-volatile working set stored at storage class memory 212. In some examples, wear leveling module 230 may support hot-pluggable operation of storage device 206. For instance, storage device 206 may be removed and/or connected with processor(s) 202 without requiring a restart of system 200.

Error correction module 232 may be configured to detect errors in data retrieved from storage class memory 212 and to correct the errors detected. In some examples, error correction module 232 may use an error-correcting code (ECC) or a forward error correction code (FEC). Examples of ECC may include, but are not limited to, hamming, Bose-Chaudhuri-Hocquenghem (BCH), low-density parity check (LDPC), or another ECC. In some examples, error correction module 232 may be configured to minimize a bit-error rate (BER) in data retrieved from storage class memory 212. For instance, error correction module 232 may use an ECC having a higher BER than hamming. In some examples, error correction module 232 may be configured to minimize a response time for ECC in data retrieved from storage class memory 212. For instance, error correction module 232 may use an ECC having a higher response time than LDPC. Other causes of variability in response times may include, but are not limited to, write and read asymmetry delay reads, macro events (e.g., overheating, wear leveling, etc.), or other causes of variability in response times. Rather than architect a storage device (e.g., resistive NVM) with deterministic latency, storage device 206 may use a protocol (e.g., coherence) that accommodates varying latency by the storage device. In some instances, error correction module 232 may be configured to perform ECC using BCH, which may have a variable latency. In any case, rather than relying on processor(s) 202 to perform ECC that accommodates various types of storage including storage class memory 212, error correction module 232 may be specifically configured for ECC for data stored at storage class memory 212. In this manner, error correction module 232 may be used to reduce a number of errors in data retrieved from storage class memory 212 prior to making the data available in buffer 216.

Data security module 236 may be configured to control access rights to data stored in storage class memory 212. For example, data security module 236 may encrypt data prior to writing the data to storage class memory 212 such that the data may not be accessed without information stored in register 214, buffer 216, or another storage component of storage environment 200. Similarly, data security module 236 may decrypt the data upon retrieving the data from storage class memory 212. In this manner, data security module 236 may be used to improve data security of data stored in storage class memory 212. For example, such encryption may protect data at rest from physical theft of storage device 206.

Address translation module 238 may associate a logical block address used by processor(s) 202 with a physical block address of storage class memory 212. For example, in response to address translation module 238 receiving, via register 214, a logical block address from processor(s) 202 as part of a read or write command, address translation module 238 may determine a physical block address of storage class memory 212 that corresponds with the logical block address using an indirection system. In some examples, address translation module 238 may use a virtual-to-physical table (V2P) that includes entries that each associate a virtual address (e.g., logical block address (LBA)) and a physical address (e.g., physical block address).

Coherency module 234 be configured to ensure a coherence state for data output at coherence bus 208. For example, processor(s) 202 may output, via a control line, an instruction into register 214 requesting data stored in storage class memory 212. While coherency module 234 processes the instruction, to ensure a consistency of data output at coherence bus 208, coherency module 234 may output, to processor(s) 202, an instruction to refrain from modifying data at buffer 216 and any local data that corresponds to the data at buffer 216 (e.g., a local copy in a local cache). In response to retrieving the command from register 214, coherency module 234 may retrieve the data from storage class memory 212 and store the data at buffer 216 indicated in the instruction for retrieval, via coherence bus 208, by the processor(s) 202. After coherency module 234 stores the data at buffer 216 indicated in the instruction for retrieval, coherency module 234 may output, to processor(s) 202, an instruction to permit modifying data at buffer 216 and any local data that corresponds to the data at buffer 216 (e.g., a local copy in a local cache). In this way, processor(s) 202 may be configured to refrain from modifying local data corresponding to the instruction to provide data to the bus after coherency module 234 receives the instruction to provide data to the bus and before coherency module 234 outputs the indication.

Coherency module 234 be configured to receive commands, via register 214, requesting data and to provide the requested data into buffer 216. For example, processor(s) 202 may output, via a control line, an instruction into register 214 requesting data stored in storage class memory 212. For example, coherency module 234 may receive, via coherence bus 208, from processor(s) 202, at register 214, an instruction to provide, to coherence bus 208, data stored by storage class memory 212 at an LBA or set of LBAs. Responsive to receiving the instruction to provide data to coherence bus 208, address translation module 238 may translate, e.g., using a V2P table, the LBA to a physical address of storage class memory 212 and cause retrieval of the data. If the data is encrypted, data security module 236 may decrypt the data stored at the physical address of storage class memory 212. Error correction module 232 may correct, e.g., using a forward error correction code, any errors present in the retrieved data. Coherency module 234 may update buffer 216 to represent the retrieved data. For example, coherency module 234 may store the retrieved data in buffer 216. Coherency module 234 may output, at coherence bus 208, an indication that the requested data is available at buffer 216. For example, coherency module 234 may set a command bit of register 214 that indicates that the requested data is available at buffer 216 (and may also indicate the location in buffer 216 at which the data is available). In this manner, coherent controller 210 may transfer data directly to buffer 216, which is accessible, via coherence bus 208, to by processor(s) 202, to increase an input/output operations per second (IOPS) of storage device 206, thereby improving a response time of storage environment 200.

Some systems may use a non-coherent controller. For example, a CPU, via a control channel, requests data from a non-coherent controller. In response to the request for data, the non-coherent controller provides the data to DRAM and outputs, via a control channel, an indication that the data is available at the DRAM. In response to receiving the indication, the CPU may retrieve, via a data channel, the data from the DRAM. However, rather than transferring data using a non-coherence bus (e.g., a PCI Express (PCIe) or serial AT attachment (SATA) bus) and then providing the data in a DRAM accessible to a coherence bus, a storage device may be configured to directly access a coherence bus.

Figure 3:
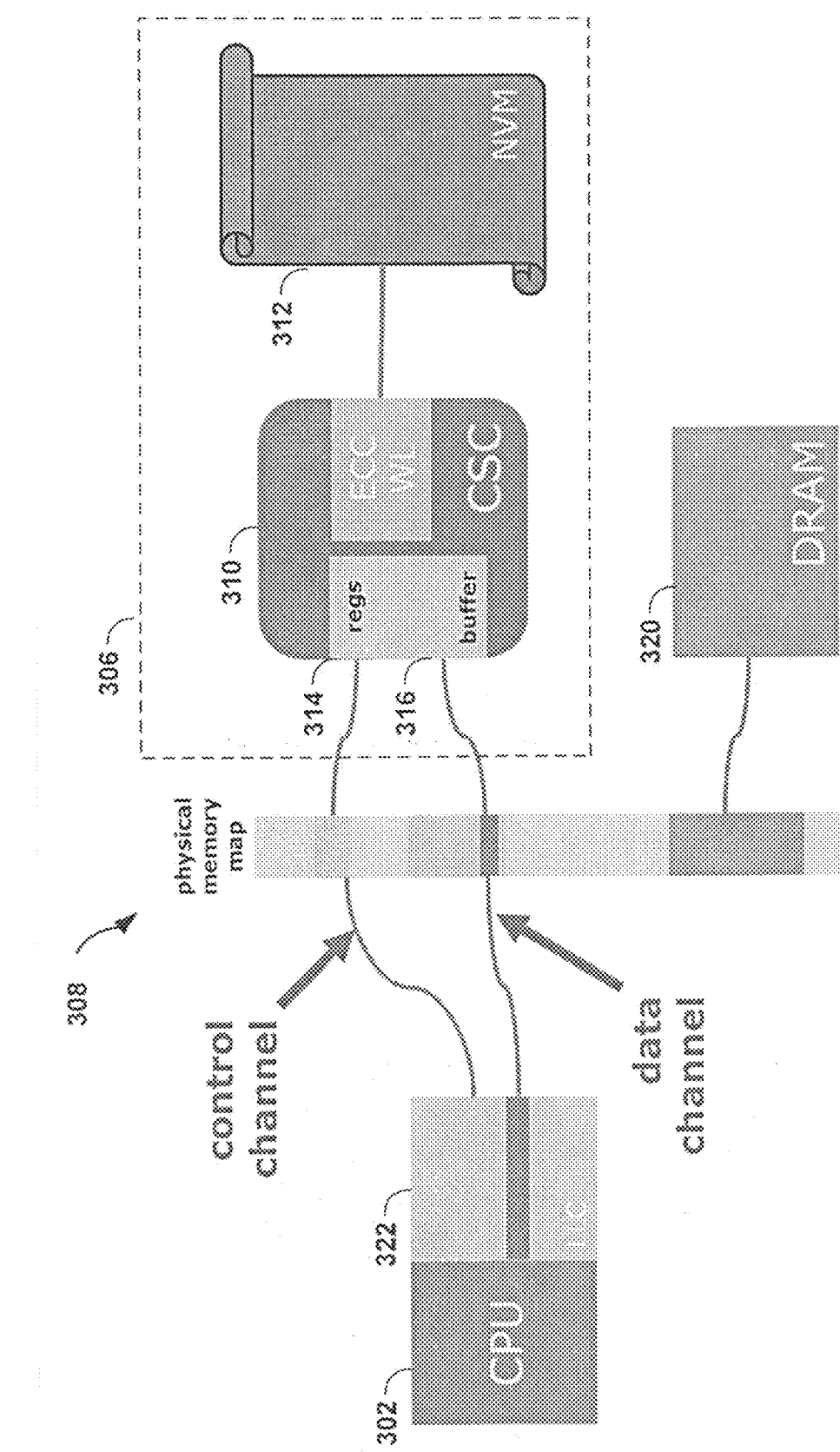
FIG. 3 is a conceptual diagram illustrating a first example operation of an example storage device configured to directly access a coherence bus, in accordance with one or more techniques of this disclosure.

FIG. 3 is a conceptual diagram illustrating a first example operation of an example storage device 306 configured to directly access a coherence bus 308, in accordance with one or more techniques of this disclosure. As illustrated in FIG. 3, storage device 306 may be connected, via coherence bus 308, to processor(s) 302. Storage device 306 may be an example of storage device 106 of FIG. 1 or storage device 206 of FIG. 2. Similarly, coherence bus 308 may be an example of coherence bus 108 of FIG. 1 or coherence bus 208 of FIG. 2, and processor(s) 302 may be an example of processor 102A of FIG. 1 or processor(s) 202 of FIG. 2.

Storage device 306 may include coherent controller 310, which may be an example of coherent controller 110 of FIG. 1 or coherent controller 210 of FIG. 2; register 314, which may be an example of register 214 of FIG. 2; buffer 316, which may be an example of buffer 216 of FIG. 2; and non-volatile memory (NVM) 312, which may be an example of storage class memory 112 of FIG. 1 or storage class memory 212 of FIG. 2.

The system of FIG. 3 is also illustrated as including DRAM 320. DRAM 320 also accesses coherency bus 308. However, in some examples, DRAM 320 may be omitted, as storage device 306 may directly access coherence bus 308 so DRAM 320 may be superfluous.

In the example of FIG. 3, CPU 302 outputs, via a control channel of coherence bus 308, an instruction to provide data to coherence bus 308 to a physical memory map that corresponds to register 314. In response to receiving the instruction to provide data to coherence bus 308, coherent controller 310 retrieves data from NVM 312, updates buffer 316 to represent the data retrieved from NVM 312, and outputs, at coherence bus 308, an indication that the requested data is available at buffer 316 by writing an instruction into register 314. In response to the outputting the indication that the requested data is available at buffer 316, CPU 302 retrieves, via coherence bus 308, the data from buffer 316.

As shown in FIG. 3, in some examples, CPU 302 includes a lower level cache 322, which also accesses coherency bus 308. Coherent controller 310 also optionally includes modules for performing error correction (e.g., similar to or substantially the same as error correction module 232 of FIG. 2), and wear leveling (e.g., similar to or substantially the same as wear leveling module 230 of FIG. 2).

By including coherent controller 310 in storage device 306, storage device 306 may directly access coherence bus 308. This may enable processor(s) 302 to benefit from the relatively low latency and relatively high throughput of NVM 312, and, in some examples, may allow removal of one or more levels in the memory hierarchy (e.g., DRAM 320).

Figure 4:
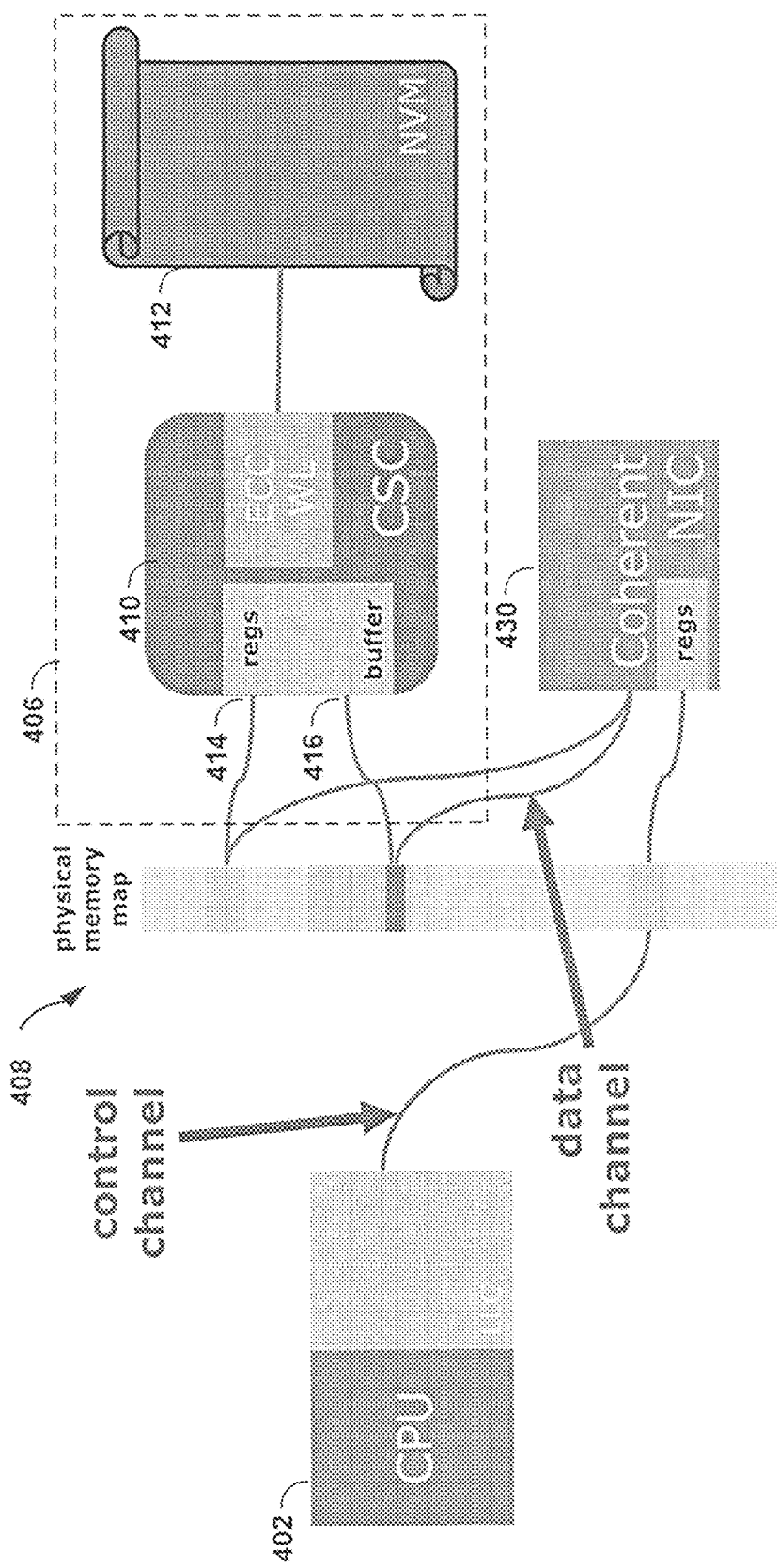
FIG. 4 is a conceptual diagram illustrating a second example operation of an example storage device configured to directly access a coherence bus, in accordance with one or more techniques of this disclosure.

FIG. 4 is a conceptual diagram illustrating a second example operation of an example storage device 406 configured to directly access a coherence bus 408, in accordance with one or more techniques of this disclosure. As illustrated in FIG. 4, coherent network interface controller 430, which may be an example of device 104A of FIG. 1, may be connected, via coherence bus 408, to processor(s) 402, which may be an example of processor 102A of FIG. 1 or processor(s) 202 of FIG. 2. Coherence bus 408 may be an example of coherence bus 108 of FIG. 1 or coherence bus 208 of FIG. 2. Storage device 406 may be an example of storage device 106 of FIG. 1 or storage device 206 of FIG. 2. For example, storage device 406 may include coherent controller 410, which may be an example of coherent controller 110 of FIG. 1 or coherent controller 210 of FIG. 2; register 414, which may be an example of register 214 of FIG. 2; buffer 416, which may be an example of buffer 216 of FIG. 2; and non-volatile memory (NVM) 412, which may be an example of storage class memory 112 of FIG. 1 or storage class memory 212 of FIG. 2.

In the example of FIG. 4, CPU 402, may output, via a control channel of coherence bus 408, an instruction to provide data to coherence bus 408 to a physical memory map that corresponds to register 414. To ensure a consistency of data stored at coherence bus 408, CPU 402 and coherent network interface controller 430 may refrain from modifying data at coherence bus 408 until storage device 406 writes an instruction into register 414 indicating that the requested data is available at buffer 416.

In response to receiving the instruction to provide data to coherence bus 408, coherent controller 410 may retrieve data from NVM 412, update buffer 416 to represent the data retrieved from NVM 412, and output, at coherence bus 408, an indication that the requested data is available at buffer 416 by writing an instruction into register 414. In this example, an amount of time for retrieving data from NVM 412 may not substantially prevent CPU 402 and coherent network interface controller 430 from accessing coherence bus 408 because NVM 412 may have a relatively fast response time.

In response to determining that the requested data is available at buffer 416, coherent network interface controller 430 may retrieve, via coherence bus 408, the requested data from buffer 416. Because storage device 406 may respond to the request by migrating data from NVM 412 directly to buffer 416, rather than accessing a relatively slow memory compared with NVM 412 and storing the requested data in a separate cache for output to coherence bus 408, the requested data may be available for use by coherent network interface controller 430 with less delay than systems that do not permit storage device 406 to directly access coherence bus 408. As such, devices using coherence bus 408 (e.g., CPU 402, storage device 406, and coherent network interface controller 430) may have lower latency compared with devices using a non-coherent bus.

Coherent network interface controller 430 is one example of a device that may be connected to coherence bus 408. Other example components will be apparent to one of ordinary skill in the art.

Figure 5:
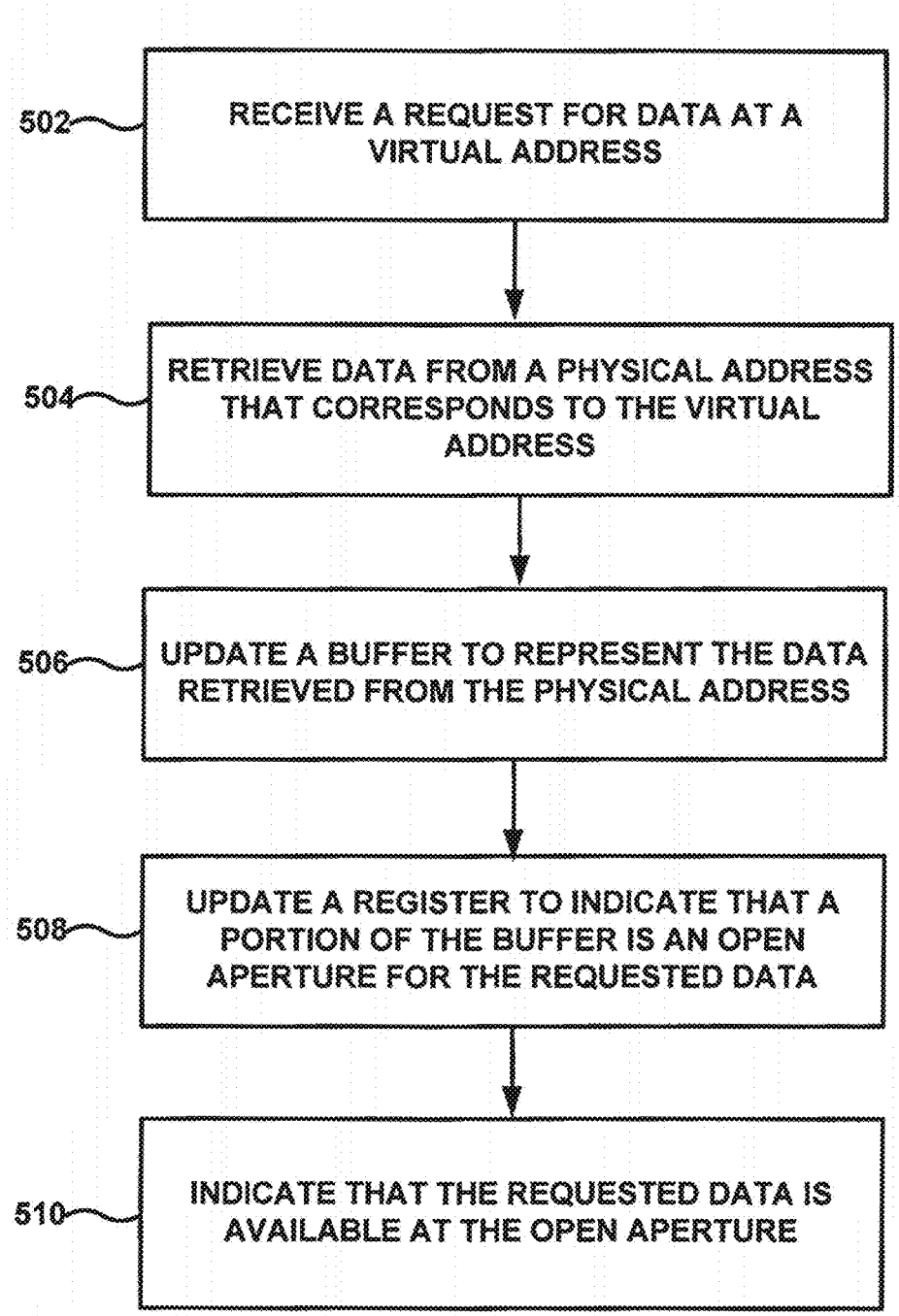
FIG. 5 is a flow diagram illustrating an example technique that a storage device may implement for directly accessing a coherence bus, in accordance with one or more techniques of this disclosure.

FIG. 5 is a flow diagram illustrating an example technique that a storage device may implement for directly accessing a coherence bus, in accordance with one or more techniques of this disclosure. The technique of FIG. 5 will be described with concurrent reference to storage environment 100 of FIG. 1 and storage environment 200 of FIG. 2 for ease of description, and may be implemented by other storage environments and systems.

Coherent controller 210 may receive, via coherence bus 208, from processor(s) 202, an instruction to provide data to coherence bus 208 (502). For example, processor(s) 202 may write, via coherence bus 208, data into register 214 indicating the instruction to provide data stored at a virtual address of storage class memory 212 to a physical memory map of coherence bus 208 that corresponds to buffer 416. Responsive to receiving the instruction to provide data to the bus, coherent controller 210 may retrieve data from storage class memory 212 (504). For example, address translation module 238 determines a physical location of the data stored at the virtual address in the instruction, data security module 236 decrypts the retrieved data, and error correction module 232 error corrects the decrypted code.

Coherent controller 210 updates buffer 216 to represent the data retrieved from the storage class memory 212 (506). For example, coherency module 234 writes the data into buffer 216. Coherent controller 210 updates register 214 to indicate that a portion of buffer 216 is an open aperture for the requested data (508). For example, coherency module 234 writes, into register 214, an instruction indicating the portion of buffer 216 that is an open aperture for the requested data. Coherent controller 210 outputs, at coherence bus 208, an indication that the requested data is available at the open aperture (510). For example, coherency module 234 writes, into register 214, an instruction indicating the instruction to provide data to coherence bus 208 is completed.

Clause 1. A system comprising: a bus; at least one processor coupled to the bus; and a storage device coupled to the bus, the storage device comprising: storage class memory; a buffer; and a controller configured to: receive an instruction to provide data to the bus; and responsive to receiving the instruction to provide data to the bus: retrieve data from the storage class memory; update the buffer to represent the data retrieved from the storage class memory; and output, at the bus, an indication that data responsive to the instruction to provide data to the bus is available at the buffer, wherein the at least one processor is configured to refrain from modifying local data corresponding to the instruction to provide data to the bus after the controller receives the instruction to provide data to the bus and before the controller outputs the indication.

Clause 2. The system of clause 1, wherein the bus comprises a coherence bus.

Clause 3. The system of any combination of clauses 1-2, wherein the controller is further configured to perform wear leveling of the storage class memory.

Clause 4. The system of any combination of clauses 1-3, wherein the controller is further configured to perform error correction of data after retrieving the data from the storage class memory and prior to updating the buffer to represent the data.

Clause 5. The system of any combination of clauses 1-4, wherein the storage class memory comprises at least one of phase change memory or resistive random-access memory.

Clause 6. The system of any combination of clauses 1-5, wherein the storage class memory comprises at least one of phase change memory or resistive random-access memory.

Clause 7. The system of any combination of clauses 1-6, wherein: the storage device further comprises a register configured to store instructions for accessing data stored at the buffer; and wherein the controller is further configured to receive the instruction to provide data to the bus via the register.

Clause 8. A method comprising: receiving, by a coherent controller, an instruction to provide data to a coherent bus, wherein at least one processor is coupled to the coherent bus; and responsive to receiving the instruction to provide data to the coherent bus: fetching, by the coherent controller, data from storage class memory; updating, by the coherent controller, a buffer to represent the data fetched from the storage class memory; and writing, by the coherent controller, at the coherent bus, an indication that data responsive to the instruction to provide data to the coherent bus is available at the buffer, wherein the at least one processor is configured to refrain from modifying local data corresponding to the instruction to provide data to the coherent bus after the coherent controller receives the instruction to provide data to the coherent bus and before the coherent controller writes the indication.

Clause 9. The method of clause 8, further comprising: performing, by the coherent controller, wear leveling of the storage class memory.

Clause 10. The method of any combination of clauses 8-9, further comprising: performing, by the coherent controller, error correction of data after retrieving the data from the storage class memory and prior to updating the buffer to represent the data.

Clause 11. The method of any combination of clauses 8-10, further comprising: controlling, by the coherent controller, access rights to data stored in the storage class memory.

Clause 12. The method of any combination of clauses 8-11, wherein the storage class memory comprises at least one of phase change memory or resistive random-access memory.

Clause 13. The method of any combination of clauses 8-12, further comprising: receiving, by the coherent controller, the instruction to provide data to the coherent bus via a register.

Clause 14. A non-transitory computer-readable storage medium encoded with instructions that, when executed, cause a controller to: receive an instruction to provide data to a bus, wherein at least one processor is coupled to the bus; and responsive to receiving the instruction to provide data to the bus: retrieve data from a storage class memory; update a buffer to represent the data retrieved from the storage class memory; and output, at the bus, an indication that data responsive to the instruction to provide data to the bus is available at the buffer, wherein the at least one processor is configured to refrain from modifying local data corresponding to the instruction to provide data to the bus after the controller receives the instruction to provide data to the bus and before the controller outputs the indication.

Clause 15. The non-transitory computer-readable storage medium of clause 14, wherein the bus comprises a coherence bus.

Clause 16. The non-transitory computer-readable storage medium of any combination of clauses 14-15, wherein the instructions further cause the controller to perform wear leveling of the storage class memory.

Clause 17. The non-transitory computer-readable storage medium of any combination of clauses 14-16, wherein the instructions further cause the controller to perform error correction of data after retrieving the data from the storage class memory and prior to updating the buffer to represent the data.

Clause 18. The non-transitory computer-readable storage medium of any combination of clauses 14-17, wherein the instructions further cause the controller to control access rights to data stored in the storage class memory.

Clause 19. The non-transitory computer-readable storage medium of any combination of clauses 14-18, wherein the storage class memory comprises at least one of phase change memory or resistive random-access memory.

Clause 20. A system comprising: means for receiving an instruction to provide data to a bus; means for retrieving data from storage class memory in response to receiving the instruction to provide data to the bus; means for updating a buffer to represent the data retrieved from the storage class memory in response to receiving the instruction to provide data to the bus; and means for outputting at the bus an indication that data responsive to the instruction to provide data to the bus is available at the buffer in response to receiving the instruction to provide data to the bus, wherein at least one processor is configured to refrain from modifying local data corresponding to the instruction to provide data to the bus after the controller receives the instruction to provide data to the bus and before the controller outputs the indication.

Clause 21. The system of clause 20, further comprising: means for performing wear leveling of the storage class memory.

Clause 22. The system of clause 20, further comprising: means for performing error correction of data after retrieving the data from the storage class memory and prior to updating the buffer to represent the data.

Clause 23. The system of clause 20, further comprising: means for controlling access rights to data stored in the storage class memory.

Clause 24. The system of clause 20, further comprising: means for receiving the instruction to provide data to the bus via a register.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

The invention claimed is:

1. A system comprising:
a bus;
at least one processor coupled to the bus; and
a storage device coupled to the bus, the storage device comprising:
storage class memory;
a buffer; and
a controller configured to:
receive an instruction to provide data to the bus; and
responsive to receiving the instruction to provide data to the bus:

retrieve data from the storage class memory;
update the buffer to represent the data retrieved from the storage class memory; and
output, at the bus, an indication that data responsive to the instruction to provide data to the bus is available at the buffer,
wherein the at least one processor is configured to refrain from modifying local data corresponding to the instruction to provide data to the bus after the controller receives the instruction to provide data to the bus and before the controller outputs the indication.

2. The system of claim 1, wherein the bus comprises a coherence bus.

3. The system of claim 1, wherein the controller is further configured to perform wear leveling of the storage class memory.

4. The system of claim 1, wherein the controller is further configured to perform error correction of data after retrieving the data from the storage class memory and prior to updating the buffer to represent the data.

5. The system of claim 1, wherein the controller is further configured to control access rights to data stored in the storage class memory.

6. The system of claim 1, wherein the storage class memory comprises at least one of phase change memory or resistive random-access memory.

7. The system of claim 1, wherein:
the storage device further comprises a register configured to store instructions for accessing data stored at the buffer; and
wherein the controller is further configured to receive the instruction to provide data to the bus via the register.

8. A method comprising:
receiving, by a coherent controller, an instruction to provide data to a coherence bus, wherein at least one processor is coupled to the coherence bus; and
responsive to receiving the instruction to provide data to the coherence bus:
fetching, by the coherent controller, data from storage class memory;
updating, by the coherent controller, a buffer to represent the data fetched from the storage class memory; and
writing, by the coherent controller, at the coherence bus, an indication that data responsive to the instruction to provide data to the coherence bus is available at the buffer,
wherein the at least one processor is configured to refrain from modifying local data corresponding to the instruction to provide data to the coherence bus after the coherent controller receives the instruction to provide data to the coherence bus and before the coherent controller writes the indication.

9. The method of claim 8, further comprising:
performing, by the coherent controller, wear leveling of the storage class memory.

10. The method of claim 8, further comprising:
performing, by the coherent controller, error correction of data after retrieving the data from the storage class memory and prior to updating the buffer to represent the data.

11. The method of claim 8, further comprising:
controlling, by the coherent controller, access rights to data stored in the storage class memory.

12. The method of claim 8, wherein the storage class memory comprises at least one of phase change memory or resistive random-access memory.

13. The method of claim 8, further comprising:
receiving, by the coherent controller, the instruction to provide data to the coherence bus via a register.

14. A non-transitory computer-readable storage medium encoded with instructions that, when executed, cause a controller to:
receive an instruction to provide data to a bus, wherein at least one processor is coupled to the bus; and
responsive to receiving the instruction to provide data to the bus:
retrieve data from a storage class memory;
update a buffer to represent the data retrieved from the storage class memory; and
output, at the bus, an indication that data responsive to the instruction to provide data to the bus is available at the buffer,
wherein the at least one processor is configured to refrain from modifying local data corresponding to the instruction to provide data to the bus after the controller receives the instruction to provide data to the bus and before the controller outputs the indication.

15. The non-transitory computer-readable storage medium of claim 14, wherein the bus comprises a coherence bus.

16. The non-transitory computer-readable storage medium of claim 14, wherein the instructions further cause the controller to perform wear leveling of the storage class memory.

17. The non-transitory computer-readable storage medium of claim 14, wherein the instructions further cause the controller to perform error correction of data after retrieving the data from the storage class memory and prior to updating the buffer to represent the data.

18. The non-transitory computer-readable storage medium of claim 14, wherein the instructions further cause the controller to control access rights to data stored in the storage class memory.

19. The non-transitory computer-readable storage medium of claim 15, wherein the storage class memory comprises at least one of phase change memory or resistive random-access memory.

20. A system comprising:
means for receiving an instruction to provide data to a bus;
means for retrieving data from storage class memory in response to receiving the instruction to provide data to the bus;
means for updating a buffer to represent the data retrieved from the storage class memory in response to receiving the instruction to provide data to the bus; and
means for outputting at the bus an indication that data responsive to the instruction to provide data to the bus is available at the buffer in response to receiving the instruction to provide data to the bus,
wherein at least one processor is configured to refrain from modifying local data corresponding to the instruction to provide data to the bus after the controller receives the instruction to provide data to the bus and before the controller outputs the indication.

21. The system of claim 20, further comprising:
means for performing wear leveling of the storage class memory.

22. The system of claim 20, further comprising:
means for performing error correction of data after retrieving the data from the storage class memory and prior to updating the buffer to represent the data.

23. The system of claim 20, further comprising:
means for controlling access rights to data stored in the storage class memory.

24. The system of claim 20, further comprising:
means for receiving the instruction to provide data to the bus via a register.

* * * * *